United States Patent [19]
Onishi

[11] Patent Number: 5,625,022
[45] Date of Patent: Apr. 29, 1997

[54] CURABLE ORGANOPOLYSILOXANE COMPOSITION

[75] Inventor: Masayuki Onishi, Chiba Prefecture, Japan

[73] Assignee: Dow Corning Toray Silicone Co., Ltd., Tokyo, Japan

[21] Appl. No.: 619,782

[22] Filed: Mar. 21, 1996

[30] Foreign Application Priority Data

Mar. 29, 1995 [JP] Japan .................................. 7-096242

[51] Int. Cl.⁶ .................................................. C08G 77/08
[52] U.S. Cl. .................. 528/15; 528/16; 528/17; 525/478; 525/479
[58] Field of Search ................ 528/15, 16, 17; 525/478, 479

[56] References Cited

U.S. PATENT DOCUMENTS

| | | | |
|---|---|---|---|
| 4,477,641 | 10/1984 | Matsumoto | 528/15 |
| 4,742,103 | 5/1988 | Morita et al. | 524/174 |
| 4,808,640 | 2/1989 | Morita et al. | 523/433 |
| 5,270,425 | 12/1993 | Van wert et al. | 528/15 |
| 5,432,280 | 7/1995 | Hara et al. | 524/730 |
| 5,504,174 | 4/1996 | Onishi | 528/15 |

FOREIGN PATENT DOCUMENTS

| | | |
|---|---|---|
| 493791 | 7/1992 | European Pat. Off. . |
| 497349 | 8/1992 | European Pat. Off. . |
| 101146 | 6/1985 | Japan . |
| 85224 | 3/1989 | Japan . |
| 178461 | 6/1992 | Japan . |
| 2270522 | 2/1994 | United Kingdom . |

*Primary Examiner*—Melvyn I. Marquis
*Attorney, Agent, or Firm*—Roger H. Borrousch

[57] ABSTRACT

Curable organopolysiloxane composition that undergoes a uniform curb by both condensation and addition reactions without being subject to cure inhibition by cure inhibitors and thereby produces cured silicone that is strongly adherent to any of various substrates residing in contact with the composition during its cure. The curable organopolysiloxane composition is a mixture of organopolysiloxane with at least 2 silicon-bonded alkoxy groups in each molecule and organopolysiloxane with at least 2 silicon-bonded lower alkenyl groups in each molecule, an organopolysiloxane containing at least 2 silicon-bonded hydrogen atoms in each molecule, an alkoxysilane of the formula $R^1_x Si(OR^2)_{(4-x)}$ where $R^1$ is a monovalent hydrocarbon group, $R^2$ is alkyl or alkoxyalkyl, and x is 0, 1, or 2 or partial hydrolysis condensate thereof, an organozirconium compound or an organoaluminum compound, and a hydrosilylation reaction catalyst in a catalytic quantity.

4 Claims, No Drawings

CURABLE ORGANOPOLYSILOXANE COMPOSITION

BACKGROUND INFORMATION

(1) Field of the Invention

This invention relates to a curable organopolysiloxane composition. More particularly, this invention relates to a curable organopolysiloxane composition that undergoes a uniform cure through both condensation and addition reactions without being subject to cure inhibition by cure inhibitors and thereby produces cured silicone that is strongly adherent to a substrate residing in contact with the composition during its cure. This strong adherence is evidenced for a variety of substrates.

(2) Prior Art

Curable organopolysiloxane compositions can be classified according to the curing mechanism into, for example, condensation reaction-curing compositions, addition reaction-curing compositions, and radical reaction-curing compositions. The condensation reaction-curing compositions are cured by atmospheric moisture to form cured silicone that is highly adherent to the particular substrate residing in contact with the composition during its cure (hereinafter abbreviated as cure-contact adherence). This strong adherence is evidenced for a variety of substrates. More specifically, compositions that cure by an alcohol-liberating condensation reaction catalyzed by a titanium condensation reaction catalyst are highly qualified for use as sealants and coatings for electrical and electronic instruments and devices because these compositions do not emit an unpleasant smell upon curing and do not corrode metals. On the other hand, the addition reaction-curing compositions cure rapidly and uniformly at room or elevated temperature without generating reaction by-products and thus are highly qualified for use as potting materials and coatings for electrical and electronic instruments and devices.

PROBLEMS TO BE SOLVED BY THE INVENTION

However, condensation reaction-curing compositions cure gradually from the sections in contact with atmospheric moisture, and as a result long periods of time can be required to achieve a uniform cure. Taking as an example the use of such a composition to attach an electrical or electronic component on a circuit board, one encounters the problem that the circuit board cannot be vibrated or moved to the next process until a sufficient component attachment force or film strength has developed during the course of the cure. The addition reaction-curing compositions evidence a poor cure-contact adherence for substrates and also suffer from cure inhibition when the substrate has picked up a cure inhibitor, for example, nitrogenous compounds, sulfur-containing compounds, phosphorus-containing compounds, tin compounds, sulfur, solder fluxes, and the like.

In order to solve these problems, Matsumoto in U.S. Pat. No. 4,477,641, issued Oct. 16, 1984 (Japanese Patent Publication Number Sho 64-2626, 1989) has proposed a curable organopolysiloxane composition that cures by both condensation and addition reactions. This composition comprises organopolysiloxane that contains at least 2 silicon-bonded alkoxy groups and at least 2 silicon-bonded lower alkenyl groups in each molecule, organopolysiloxane that contains at least 2 silicon-bonded hydrogen atoms in each molecule, and hydrosilylation reaction catalyst. This composition, however, still does not develop an adequate cure-contact adherence for various substrates and is still easily inhibited by cure inhibitors.

SUMMARY OF THE INVENTION

The inventor achieved the present invention as a result of extensive investigations directed to solving the above-described problems.

The present invention takes as its object of a curable organopolysiloxane composition that undergoes a uniform cure through both condensation and addition reactions without being subject to cure inhibition by cure inhibitors and thereby produces cured silicone that is strongly adherent to any of various substrates residing in contact with the composition during its cure.

MEANS SOLVING THE PROBLEMS AND FUNCTION THEREOF

The present invention relates to a curable organopolysiloxane composition comprising (A) 100 parts by weight of a mixture of (a) an organopolysiloxane with a viscosity at 25° C. of 0.02 to 1,000 Pa.s that contains at least 2 silicon-bonded alkoxy groups in each molecule and the monovalent organic groups bonded to the silicon atoms other than the alkoxy groups are monovalent hydrocarbon groups or monovalent halogenated hydrocarbon groups, and (b) an organopolysiloxane with a viscosity at 25° C. of 0.02 to 1,000 Pa.s that contains at least 2 silicon-bonded lower alkenyl groups in each molecule, (B) an organopolysiloxane that contains at least 2 silicon-bonded hydrogen atoms in each molecule, in a quantity that gives a value in the present composition of 0.3 to 5 moles of silicon-bonded hydrogen in this component to one mole of silicon-bonded lower alkenyl in component (b), (C) 0.1 to 20 parts by weight of an alkoxysilane with the general formula $R^1_x Si(OR^2)_{(4-x)}$ where $R^1$ represents a monovalent hydrocarbon group, $R^2$ is alkyl or alkoxyalkyl, and E is 0, 1, or 2 or partial hydrolysis condensate thereof, (D) 0.01 to 20 parts by weight of an organozirconium compound or organoaluminum compound, and (E) a hydrosilylation reaction catalyst in a catalytic quantity.

DETAILED DESCRIPTION OF THE PREFERRED EMBODIMENTS

Component (A) is the base ingredient of the present composition, and it is a mixture of (a) an organopolysiloxane with a viscosity at 25° C. of 0.02 to 1,000 Pa.s that contains at least 2 silicon-bonded alkoxy groups in each molecule and the monovalent groups bonded to the silicon atoms of the organopolysiloxane other than the alkoxy groups are monovalent hydrocarbon groups or monovalent halogenated hydrocarbon groups and (b) an organopolysiloxane with a viscosity at 25° C. of 0.02 to 1,000 Pa.s that contains at least 2 silicon-bonded lower alkenyl groups in each molecule. The proportions of components (a) and (b) in component (A) may be freely chosen, but as a particular matter component (a) preferably makes up 10 to 90 weight percent while component (b) accounts for the remaining weight percent where the total weight of (a) plus (b) is 100 weight percent. Component (a) must contain at least 2 silicon-bonded alkoxy groups in each molecule. When fewer than 2 silicon-bonded alkoxy groups are present in each molecule, the resulting composition will not undergo a thorough cure and in addition will be prone to cure inhibition. The silicon-bonded alkoxy in component (a) is exemplified by methoxy, ethoxy, propoxy, and butoxy wherein methoxy is specifically preferred. The bonding position for the alkoxy in component (a) is not crucial, but preferably at least 1 of its bonding positions is at the molecular chain terminals due to the corresponding good curability of the resulting composition.

The molecular chain terminal groups for component (a) are exemplified by alkoxy-siloxy groups such as trimethoxysiloxy, methyldimethoxysiloxy, phenyldimethoxysiloxy, triethoxysiloxy, methyldiethoxysiloxy, and the like, and by alkoxysilylalkyl groups such as tri-methoxysilylethyl, trimethoxysilylpropyl, methyldimethoxysilyl-ethyl, methyldimethoxysilylpropyl, triethoxysilylethyl, and so forth. The trimethoxysilyl group is particularly preferred. The non-alkoxy silicon-bonded monovalent organic groups in component (a) are monovalent hydrocarbon groups or monovalent halogenated hydrocarbon groups exemplified by alkyl groups such as methyl, ethyl, propyl, butyl, pentyl, hexyl, heptyl, octyl, nonyl, decyl, octadecyl, and so forth; cycloalkyl groups such as cyclopentyl, cyclohexyl, and so forth; aryl groups such as phenyl, tolyl, xylyl, naphthyl, and so forth; aralkyl groups such as benzyl, phenethyl, phenylpropyl, and so forth; and haloalkyl groups such as 3-chloropropyl, 3,3,3-trifluoropropyl, and so forth. Methyl and phenyl are specifically preferred.

The molecular structure of component (a) is also not crucial, and this component may have, for example, a straight-chain, partially branched straight-chain, branched, cyclic, or resin structure. Straight-chain structures are particularly preferred. A straight-chain component (a) can have the following general formula

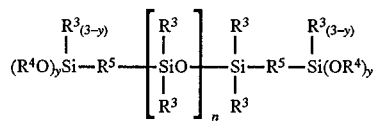

in which $R^3$ represents a monovalent hydrocarbon group, $R^4$ represents an alkyl group, $R^5$ is an oxygen atom or an alkylene group, y is 1, 2, or 3, and n is a number that yields a viscosity at 25° C. of 0.02 to 1,000 Pa.s for the organopolysiloxane with this formula. The monovalent hydrocarbon groups encompassed by $R^3$ in the preceding formula are exemplified by alkyl groups such as methyl, ethyl, propyl, butyl, pentyl, hexyl, heptyl, octyl, nonyl, decyl, octadecyl, and so forth; cycloalkyl groups such as cyclopentyl, cyclohexyl, and so forth; aryl groups such as phenyl, tolyl, xylyl, naphthyl, and so forth; aralkyl groups such as benzyl, phenethyl, phenylpropyl, and so forth; and haloalkyl groups such as 3-chloropropyl, 3,3,3-trifluoropropyl, and so forth. Methyl and phenyl are specifically preferred. The alkyl groups encompassed by $R^4$ are exemplified by methyl, ethyl, propyl, and butyl wherein methyl and ethyl are specifically preferred. The alkylene groups encompassed by $R^5$ are exemplified by ethylene, propylene, and methylethylene wherein ethylene and propylene are specifically preferred. The subscript y is 1, 2, or 3, and a value of 3 is specifically preferred. Finally, n is a number that yields a viscosity at 25° C. of 0.02 to 1,000 Pa.s for the organopolysiloxane with the preceding formula.

Component (a) should have a viscosity at 25° C. from 0.02 to 1,000 Pa.s and preferably from 0.1 to 500 Pa.s. When its viscosity at 25° C. is less than 0.02 Pa.s, the ultimately obtained cured silicone will suffer from substantially reduced physical properties, particularly in regards to flexibility and elongation. When, on the other hand, its viscosity exceeds 1,000 Pa.s, the handling characteristics of the resulting composition will be strongly impaired.

Component (b) must contain at least 2 silicon-bonded lower alkenyl groups in each molecule. The resulting composition will not undergo a thorough cure when each molecule contains fewer than 2 silicon-bonded lower alkenyl groups. The molecular structure of component (b) is not crucial, and this component may have, for example, a straight-chain, partially branched straight-chain, branched, cyclic, or resin structure. Straight-chain and resin structures are specifically preferred. The lower silicon-bonded alkenyl in component (b) is exemplified by vinyl, allyl, butenyl, pentenyl, and hexenyl wherein vinyl is specifically preferred. The bonding position for the lower alkenyl in component (b) is not critical, but preferably at least 1 of its bonding positions is at the molecular chain terminals due to the corresponding excellent curability of the resulting composition. The molecular chain terminal groups are exemplified by trimethylsiloxy, dimethylvinylsiloxy, dimethylphenylsiloxy, and methylvinylphenylsiloxy with trimethylsiloxy and dimethylvinylsiloxy being specifically preferred. The silicon-bonded organic groups in component (b) other than the lower alkenyl are exemplified by alkyl groups such as methyl, ethyl, propyl, butyl, pentyl, hexyl, heptyl, octyl, nonyl, decyl, octadecyl, and so forth; cycloalkyl groups such as cyclopentyl, cyclohexyl, and so forth; aryl groups such as phenyl, tolyl, xylyl, naphthyl, and so forth; aralkyl groups such as benzyl, phenethyl, phenylpropyl, and so forth; and haloalkyl groups such as 3-chloropropyl, 3,3,3-trifluoropropyl, and so forth. Methyl and phenyl are specifically preferred.

Component (b) has a viscosity at 25° C. of 0.02 to 1,000 Pa.s and preferably 0.1 to 500 Pa.s. When its viscosity at 25° C. is less than 0.02 Pa.s, the ultimately obtained cured silicone will suffer from substantially reduced physical properties, particularly in regards to flexibility and elongation. When, on the other hand, its viscosity exceeds 1,000 Pa.s, the handling characteristics of the resulting composition will be strongly impaired.

Component (B), which functions to crosslink component (b), is an organopolysiloxane that contains at least 2 silicon-bonded hydrogen atoms in each molecule. The molecular structure of component (B) is not critical, and this component may have, for example, a straight-chain, partially branched straight-chain, cyclic, or resin structure. Straight-chain and resin structures are specifically preferred. The bonding position for the silicon-bonded hydrogen in component (B) is not critical, and it may be bonded, for example, in terminal or non-terminal position. The silicon-bonded organic groups in component (B) are exemplified by alkyl groups such as methyl, ethyl, propyl, butyl, pentyl, hexyl, heptyl, octyl, nonyl, decyl, octadecyl, and so forth; cycloalkyl groups such as cyclopentyl, cyclohexyl, and so forth; aryl groups such as phenyl, tolyl, xylyl, naphthyl, and so forth; aralkyl groups such as benzyl, phenethyl, phenylpropyl, and so forth; and haloalkyl groups such as 3-chloropropyl, 3,3,3-trifluoropropyl, and so forth. Methyl and phenyl are specifically preferred. The viscosity of component (B) at 25° C. is not a critical issue, but is preferably 0.001 to 10 Pa.s.

Component (B) should be present in the subject composition in a quantity that yields a value from 0.3 to 5 moles of the silicon-bonded hydrogen in this component to one mole of the silicon-bonded lower alkenyl in component (b). Compositions in which the molar ratio is below 0.3 will not undergo a thorough cure. Compositions in which the molar ratio exceeds 5 suffer from such problems as the evolution of hydrogen during their cure and substantially impaired physical properties and impaired heat resistance on the part of their cured silicone products.

Component (C), which functions to crosslink component (a), is an alkoxysilane with the general formula $R^1{}_x Si(OR^2)_{(4-x)}$ or the partial hydrolysis condensate thereof. The monovalent hydrocarbon groups encompassed by $R^1$ in the preceding formula are exemplified by alkyl groups such as methyl, ethyl, propyl, butyl, pentyl, hexyl, heptyl, octyl, nonyl, decyl, octadecyl, and so forth; cycloalkyl groups such as cyclopentyl, cyclohexyl, and so forth; alkenyl groups such as vinyl, allyl, and so forth; aryl groups such as phenyl, tolyl, xylyl, naphthyl, and so forth; aralkyl groups such as benzyl, phenethyl, phenylpropyl, and so forth; and haloalkyl groups such as 3-chloropropyl, 3,3,3-trifluoropropyl, and so forth. Methyl, vinyl, and phenyl are specifically preferred. The alkyl groups encompassed by $R^2$ are exemplified by methyl, ethyl, propyl, butyl, pentyl, hexyl, heptyl, octyl, nonyl, decyl, and octadecyl wherein methyl and ethyl are specifically preferred. The alkoxyalkyl groups encompassed by $R^2$ are exemplified by methoxyethyl, ethoxyethyl, methoxypropyl, and methoxybutyl wherein methoxyethyl is specifically preferred. The subscript x in the preceding formula is 0, 1, or 2, wherein a value of 1 is specifically preferred. Component (C) is exemplified by tetrafunctional alkoxysilanes such as tetramethoxysilane, tetraethoxysilane, and methyl Cellosolve orthosilicate; by trifunctional alkoxysilanes such as methyltrimethoxysilane, methyltriethoxysilane, ethyltrimethoxysilane, vinyltrimethoxysilane, phenyltrimethoxysilane, methyltrimethoxyethoxysilane, and so forth; by difunctional alkoxysilanes such as dimethyldimethoxysilane, diphenyldimethoxysilane, and so forth; and by the partial hydrolysis condensates of the preceding alkoxysilanes. Component (C) may take the form of a single selection or the mixture of two or more selections from the described alkoxysilanes and partial hydrolysis condensates thereof.

Component (C) is added at from 0.1 to 20 parts by weight and preferably from 1 to 10 parts by weight, in each case per 100 parts by weight component (A). The addition of less than 0.1 part by weight component (C) per 100 weight parts component (A) results in compositions that do not undergo a thorough cure, thicken and gel during storage, and have a reduced adherence for various substrates. The addition of more than 20 parts by weight yields compositions that cure very slowly and are thus uneconomical.

Component (D), which is an organozirconium compound or an organoaluminum compound, is a curing catalyst for the present composition that accelerates the condensation reaction. Organozirconium compounds encompassed by component (D) are exemplified by zirconium alcoholates such as zirconium tetrapropylate, zirconium tetrabutylate, and so forth, and by zirconium chelates such as zirconyl diacetate, zirconium tetra(acetylacetonate), tributoxyzirconium acetylacetonate, dibutoxyzirconium bis(acetylacetonate), tributoxyzirconium acetoacetate, dibutoxyzirconium acetylacetonate(ethylacetoacetate), and so forth. Organoaluminum compounds encompassed by component (D) are exemplified by aluminum alcoholates such as aluminum triethylate, aluminum triisopropylate, aluminum tri(sec-butylate), mono (sec-butoxy) aluminum diisopropylate, and so forth, and by aluminum chelates such as diisopropoxyaluminum (ethylacetoacetate), aluminum tris (ethyl acetoacetate), aluminum bis (ethyl acetoacetate) monoacetylacetonate, aluminum tris(acetylacetonate), and so forth. The organozirconium compound or organoaluminum compound is preferably dissolved or dispersed to homogeneity in the present composition, and organic solvent is preferably used to achieve said uniform dissolution or dispersion.

Component (D) is added at 0.01 to 20 parts by weight and preferably at 0.1 to 5 weight parts, in each case per 100 parts by weight component (A). Compositions that contain less than 0.01 part by weight component (D) per 100 parts by weight component (A) cure very slowly and are very prone to suffer from cure inhibition. Compositions containing more than 20 parts by weight suffer from a poor storage stability.

The hydrosilylation reaction catalyst (E) is a curing catalyst for the composition under consideration that accelerates the addition reaction. The known hydrosilylation reaction catalysts can be used as (E), for example, platinum catalysts such as platinum black, platinum-on-active carbon, platinum-on-silica micropowder, chloroplatinic acid, alcohol solutions of chloroplatinic acid, platinum-olefin complexes, platinum-vinylsiloxane complexes, and so forth; palladium catalysts such as tetrakis(triphenylphosphine) palladium and the like; and rhodium catalysts. Platinum catalysts are specifically preferred.

Component (E) is added in a catalytic quantity. When a platinum catalyst is used for component (E), component (E) preferably supplies from 0.1 to 1,000 weight-ppm platinum metal referred to component (A) and particularly preferably 0.5 to 200 weight-ppm platinum metal referred to component (A).

The present composition is prepared by mixing components (A) to (E) to homogeneity. When the curability of the one-package composition declines with time during storage, the present composition preferably is stored divided into at least two parts wherein these are mixed to homogeneity just before use. The present composition is preferably stored in two-packages consisting of compositions (I) and (II)—with the proviso that the total amount of components (a) and (b) in the curable organopolysiloxane composition obtained by mixing said compositions (I) and (II) comes to 100 parts by weight. Composition (I) is a mixture of component (b), 0.01 to 20 parts by weight component (D), and component (E) in a catalytic quantity. Composition (II) is a mixture of component (a) or a mixture of components (a) and (b), component (B) in a quantity that gives a value—in the curable organopolysiloxane composition obtained by mixing compositions (I) and (II)—of 0.3 to 5 moles of silicon-bonded hydrogen in component (B) to one mole of silicon-bonded lower alkenyl in component (b), and 0.1 to 20 parts by weight component (C)

With regard to optional components, the present composition may, for example, contain cure inhibitor for the purpose of improving its storage stability and handling characteristics. Said cure inhibitor is nonexhaustively exemplified by acetylenic compounds such as 3-methyl-1-butyn-3-ol, 3,5-dimethyl-1-hexyn-3-ol, phenylbutynol, and the like; ene-yne compounds such as 3-methyl-3-penten-1-yne, 3,5-dimethyl-3-hexen-1-yne, and the like; 1,3,5,7-tetramethyl-1,3,5,7-tetravinylcyclotetrasiloxane; 1,3,5,7-tetramethyl-1,3,5,7-tetrahexenylcyclotetrasiloxane; triazoles such as benzotriazole and the like; phosphines; mercaptans; and hydrazines. The quantity of addition of the cure inhibitor may be freely selected, but ordinarily is preferably in the range from 0.001 to 5 parts by weight per 100 parts by weight component (A). Other optional components are exemplified by inorganic fillers such as dry-process silicas, wet-process silicas, quartz powder, calcium carbonate, titanium oxide, diatomaceous earth, aluminum oxide, aluminum hydroxide, zinc oxide, iron oxide, cerium oxide, cerium hydroxide, zinc carbonate, manganese carbonate, mica, clay, carbon black, graphite, glass beads, and so forth; the aforesaid inorganic fillers after surface treatment with an organoalkoxysilane such as methyltrimethoxysilane, an organohalosilane such as trimethylchlorosilane, an organosilazane such as hexamethyldisilazane, or siloxane oligomer such as silanol-endblocked dimethylsiloxane oligomer, silanol-endblocked methylphenylsiloxane oligomer, silanol-endblocked methylvinylsiloxane oligomer, and so forth; organic solvent such as toluene, xylene, acetone, methyl ethyl ketone, methyl isobutyl ketone, hexane, heptane, and so forth; noncrosslinking diorganopolysiloxanes such as trimethylsiloxy-endblocked dimethylpolysiloxanes, trimethylsiloxy-endblocked methylphenylpolysiloxanes, and so forth; flame retardants; heat stabilizers; plasticizers; thixotropy donors; adhesion promoters; and antimolds.

In the presence of moisture the present composition undergoes a uniform cure, either at room temperature or with heating, through both addition and condensation reactions to yield a cured silicone gel, rubber, or resin. When the objective is the formation of a silicone rubber that will satisfactorily attach an electrical or electronic component on a circuit board, component (a) and/or component (b) in component (A) preferably have (has) a substantially straight-chain molecular structure. The subject composition evidences an excellent cure-contact adherence for a variety of substrates, does not emit unpleasant smells during its cure or corrode metals, and undergoes a uniform cure rapidly. As a consequence of these features, it is highly qualified for use as a sealant, coating, or potting material for electrical and electronic instruments, devices, and appliances and as an adhesive for attaching electrical and electronic components on circuit boards.

The curable organopolysiloxane composition according to the present invention will be explained in greater detail hereinbelow through working examples. The values reported for the viscosity in the examples were measured at 25° C. Part or parts represent part by weight or parts by weight respectively. The adherence was scored in the examples according to the following scale.

++=excellent adherence
+=only partial adherence
x=complete absence of adherence

EXAMPLE 1

The following were mixed to homogeneity to give a curable organopolysiloxane composition:
100 parts of a mixture of 50 parts trimethoxysiloxy-endblocked dimethylpolysiloxane with a viscosity of 15 Pa.s and 50 parts vinyl-functional siloxane copolymer (vinyl content=1 wt %) with a viscosity of 7 Pa.s composed of the $SiO_{4/2}$, $(CH_3)_3SiO_{1/2}$, and $(CH_3)_2(CH_2=CH)SiO_{1/2}$ units;
6 parts dry-process silica micropowder (BET specific surface=200 $m^2$/g) whose surface had been treated with hexamethyldisilazane;
3 parts trimethylsiloxy-endblocked dimethylsiloxane-methylhydrogensiloxane copolymer (silicon-bonded hydrogen content=0.7 wt %) with a viscosity of 0.01 Pa.s;
isopropanolic chloroplatinic acid solution in a quantity giving 5 weight-ppm platinum metal referred to the above-described mixture;
2 parts methyltrimethoxysilane;
0.5 part zirconium tetra (acetylacetonate); and
0.05 part 2-phenyl-3-butyn-2-ol.

Adhesion test specimens in which the adhesive was silicone rubber were fabricated by coating the above-described composition to a thickness of 1 mm between 2 aluminum panels in accordance with Japanese Industrial Standard (JIS) K 6850 and heating the resulting assembly for 30 minutes in a 120° C. forced-circulation oven. An adhesion test specimen was also additionally held for 7 days at 20° C./55% RH. The adhesive strength of the silicone rubbers (adhesive strength in shear) was then measured both immediately after heating and after the heating and additional holding for 7 days at 20° C./55% RH. In another test series, a bead of the above-described composition was also applied to each of the adherends listed in Table 1, and in each case the silicone rubber was produced by heating for 30 minutes in a 120° C. forced-circulation oven. In yet another test series, this heating was again followed by an additional holding period of 7 days at 20° C./55% RH. The adhesiveness of these silicone rubbers for the particular adherend was measured both immediately after the heating episode and after the heating and additional holding for 7 days at 20° C./55% RH. The results were as reported in Table 1.

EXAMPLE 2

A curable organopolysiloxane composition was prepared as in Example 1, but in this case using aluminum tris (acetylacetonate) in place of the zirconium tetra (acetylacetonate) that was used in Example 1. The adhesive strength and adherence spectrum of the silicone rubbers prepared as in Example 1 were measured, and these results are reported in Table 1.

COMPARATIVE EXAMPLE 1

A curable organopolysiloxane composition was prepared by mixing the following to homogeneity:
100 parts trimethoxysiloxy-endblocked dimethylpolysiloxane with a viscosity of 15 Pa.s,
6 parts dry-process silica micropowder (BET specific surface=200 $m^2$/g) whose surface had been treated with hexamethyldisilazane,
4 parts methyltrimethoxysilane, and
0.5 part zirconium tetra(acetylacetonate).
The adhesive strength and adherence spectrum of the silicone rubbers prepared as in Example 1 were measured, and these results were as reported in Table 1.

COMPARATIVE EXAMPLE 2

A curable organopolysiloxane composition was prepared by mixing the following to homogeneity:
100 parts vinyl-functional siloxane copolymer (vinyl content=1 wt %) with a viscosity of 7 Pa.s composed of the $SiO_{4/2}$, $(CH_3)_3SiO_{1/2}$, and $(CH_3)_2(CH_2=CH)SiO_{1/2}$ units;
6 parts dry-process silica micropowder (BET specific surface=200 $m^2$/g) whose surface had been treated with hexamethyldisilazane;
3 parts trimethylsiloxy-endblocked dimethylsiloxane-methylhydrogensiloxane copolymer (silicon-bonded hydrogen content=0.7 wt %) with a viscosity of 0.01 Pa.s; and
isopropanolic chloroplatinic acid solution in a quantity giving 10 weight-ppm platinum metal referred to the vinyl-functional siloxane copolymer. The adhesive strength and adherence spectrum of the silicone rubbers prepared as in Example 1 were measured, and these results were as reported in Table 1.

TABLE 1

|  | Present Invention | | Comparative Examples | |
|---|---|---|---|---|
|  | Example 1 | Example 2 | Comp. Ex. 1 | Comp. Ex. 2 |
| Adhesive strength of the silicone rubber immediately after heating, kgf/cm² | 7 | 7 | <0.1 | 6 |
| Adhesive strength of the silicone rubber after heating and then standing for an additional 7 days at 20° C./55% RH kgf/cm² | 18 | 14 | 5 | 7 |
| Adherence by the silicone rubber immediately after heating |  |  |  |  |
| Aluminum | + | + | curing | × |
| Stainless steel | × | × | only | × |
| Glass | + | + | at | × |
| Polycarbonate resin | + | × | the | × |
| Polyphenylene sulfide resin | × | × | surface | × |
| Adherence by the silicone rubber after heating and then standing for an additional 7 days at 20° C./55% RH |  |  |  |  |
| Aluminum | ++ | ++ | ++ | × |
| Stainless steel | ++ | ++ | ++ | × |
| Glass | ++ | ++ | ++ | × |
| Polycarbonate resin | ++ | ++ | ++ | × |
| Polyphenylene sulfide resin | ++ | ++ | ++ | × |

EXAMPLE 3

The curable organopolysiloxane composition described in Example 1 was formulated into a two-package product consisting of the compositions (I) and (II) described below.

Composition (I): 50 parts of vinyl-functional siloxane copolymer (vinyl content=1 wt %) with a viscosity of 7 Pa.s composed of the $SiO_{4/2}$, $(CH_3)_3SiO_{1/2}$, and $(CH_3)_2(CH_2=CH)SiO_{1/2}$ units; 3 parts of dry-process silica micropowder (BET specific surface=200 m²/g) whose surface had been treated with hexamethyldisilazane; 0.5 part of zirconium tetra(acetylacetonate); and isopropanolic chloroplatinic acid solution in a quantity giving 10 weight-ppm platinum metal referred to the vinyl-functional siloxane copolymer.

Composition (II): 50 parts of trimethoxysiloxy-endblocked dimethylpolysiloxane with a viscosity of 15 Pa.s, 3 parts of dry-process silica micropowder (BET specific surface=200 m²/g) whose surface had been treated with hexamethyldisilazane, 3 parts trimethylsiloxy-endblocked dimethylsiloxane-methylhydrogensiloxane copolymer (silicon-bonded hydrogen content=0.7 wt %) with a viscosity of 0.01 Pa.s, 2 parts methyltrimethoxy-silane, and 0.05 part 2-phenyl-3-butyn-2-ol.

A curable organopolysiloxane composition was prepared by mixing about 54 parts composition (I) and about 58 parts composition (II) to homogeneity. Silicone rubber was then prepared by heating this composition in a 120° C. forced-circulation oven for 30 minutes. The durometer of this silicone rubber was measured using the JIS A durometer specified in JIS K 6301. The durometer was also measured by the same method on the silicone rubber after an additional holding period for 7 days at 20° C./55% RH. These results were as reported in Table 2.

After their preparation, compositions (I) and (II) were also sealed into separate glass bottles and held for 7 days at 20° C. After this holding period, the curable organopolysiloxane composition was prepared by mixing about 54 parts of this composition (I) and about 58 parts of this composition (II) to homogeneity. This composition was cured as above to give silicone rubber, whose durometer was measured as above. The durometer was also measured by the same method on the silicone rubber after an additional holding period of 7 days at 20° C./55% RH. These results were reported in Table 2.

In addition, the one-package curable organopolysiloxane composition described in Example 1 was sealed immediately after its preparation into a glass bottle and held in this state for 7 days at 20° C. This composition was then cured as above to yield a silicone rubber whose durometer was measured as above. The durometer of this silicone rubber was also measured as above after the silicone rubber had been held for 7 days at 20° C./55% RH. These results were as reported in Table 2.

EXAMPLE 4

The curable organopolysiloxane composition described in Example 2 was also formulated into a two-package product consisting of the compositions (I) and (II) described below.

Composition (I): 50 parts vinyl-functional siloxane copolymer (vinyl content=1 wt %) with a viscosity of 7 Pa.s composed of the $SiO_{4/2}$, $(CH_3)_3SiO_{1/2}$, and $(CH_3)_2(CH_2=CH)SiO_{1/2}$ units; 3 parts dry-process silica micropowder (BET specific surface=200 m²/g) whose surface had been treated with hexamethyldisflazane; 0.5 part aluminum tris(acetylacetonate); and isopropanolic chloroplatinic acid solution in a quantity giving 10 weight-ppm platinum metal referred to the vinyl-functional siloxane copolymer.

Composition (II): 50 parts trimethoxysiloxy-endblocked dimethylpolysiloxane with a viscosity of 15 Pa.s, 3 parts dry-process silica micropowder (BET specific surface=200 m²/g) whose surface had been treated with hexamethyldisilazane, 3 parts trimethylsiloxy-endblocked dimethylsiloxane-methylhydrogensiloxane copolymer (silicon-bonded hydrogen content=0.7 wt %) with a viscosity of 0.01 Pa.s, 2 parts methyltrimethoxy-silane, and 0.05 part-2-phenyl-3-butyn-2-ol.

A curable organopolysiloxane composition was prepared by mixing about 54 parts composition (I) and about 58 parts composition (II) to homogeneity. Silicone rubber was then prepared by heating this composition in a 120° C. forced-circulation oven for 30 minutes. The durometer of this silicone rubber was measured using the JIS A durometer specified in JIS K 6301. The durometer was also measured by the same method on the silicone rubber after an additional holding period for 7 days at 20° C./55% RH. These results were as reported in Table 2.

After their preparation, compositions (I) and (II) were also sealed into separate glass bottles and held for 7 days at 20° C. After this holding period, the curable organopolysiloxane composition was prepared by mixing about 54 parts of this composition (I) and about 58 parts of this composition (II)

to homogeneity. This composition was cured as above to give silicone rubber, whose durometer was measured as above. The durometer was also measured by the same method on the silicone rubber after an additional holding period of 7 days at 20° C./55% RH. These results were as reported in Table 2.

In addition, the one-package curable organopolysiloxane composition described in Example 2 was sealed immediately after its preparation into a glass bottle and held in this state for 7 days at 20° C. This composition was then cured as above to yield a silicone rubber whose durometer was measured as above. The durometer of this silicone rubber was also measured as above after the silicone rubber had been held for 7 days at 20° C./55% RH. These results were as reported in Table 2.

TABLE 2

|  | Example 3 | | Example 4 | |
| --- | --- | --- | --- | --- |
|  | Two-Package | One-Package | Two-Package | One-Package |
| For the curable organopolysiloxane composition immediately after its preparation | | | | |
| Durometer of the silicone rubber prepared by heating (JIS A) | 24 | 24 | 25 | 25 |
| Durometer of the silicone rubber after heating and the additional holding period of 7 days at 20° C./55% RH (JIS A) | 32 | 32 | 29 | 29 |
| For the curable organopolysiloxane composition after its preparation and the holding for 7 days at 20° C. | | | | |
| Durometer of the silicone rubber prepared by heating (JIS A) | 25 | 17 | 24 | 19 |
| Durometer of the silicone rubber after heating and the additional holding period of 7 days at 20° C./55% RH (JIS A) | 33 | 25 | 30 | 25 |

EFFECTS OF THE INVENTION

The curable organopolysiloxane composition according to the present invention, which comprises components (A) to (E), is characterized by its ability to cure uniformly by condensation and addition reactions without being subject to cure inhibition by cure inhibitors. Moreover, this cure yields a cured silicone that evidences an excellent cure-contact adherence for a variety of substrates. The formulation of the curable organopolysiloxane composition according to the present invention as a two-package product with specific package compositions can inhibit its timewise decline in curability during storage.

That which is claimed is:

1. A curable organopolysiloxane composition comprising (A) 100 parts by weight of a mixture of
  (a) an organopolysiloxane with a viscosity at 25° C. of 0.02 to 1,000 Pa.s that contains at least 2 silicon-bonded alkoxy groups in each molecule and the monovalent organic groups bonded to the silicon atoms other than the alkoxy groups are monovalent hydrocarbon groups or monovalent halogenated hydrocarbon groups, and
  (b) an organopolysiloxane with a viscosity at 25° C. of 0.02 to 1,000 Pa.s that contains at least 2 silicon-bonded lower alkenyl groups in each molecule, (B) an organopolysiloxane that contains at least 2 silicon-bonded hydrogen atoms in each molecule, in a quantity that gives a value in the present composition of 0.3 to 5 moles of silicon-bonded hydrogen in this component to one mole of silicon-bonded lower alkenyl in component (b), (C) 0.1 to 20 parts by weight of an alkoxysilane with the general formula $R^1_x Si(OR^2)_{(4-x)}$ where $R^1$ represents a monovalent hydrocarbon group, $R^2$ is alkyl or alkoxyalkyl, and x is 0, 1, or 2 or partial hydrolysis condensate thereof, (D) 0.01 to 20 parts by weight of an organozirconium compound or organoaluminum compound, and (E) a hydrosilylation reaction catalyst in a catalytic quantity.

2. The curable organopolysiloxane composition according to claim 1, consisting of two-packages consisting of composition (I) and composition (II), with the proviso that the total of components (a) and (b) is 100 weight parts, where composition (I) comprises (b), (D), and (E) and composition (II) comprises (a) or a mixture of (a) and (b), (B), and (C).

3. The curable organopolysiloxane composition according to claim 1, in component (a) constitutes 10 to 90 weight percent of the total of components (a) and (b) and component (b) constitutes the remaining weight percent where the total weight of (a) plus (b) is 100 weight percent.

4. The curable organopolysiloxane composition according to claim 2, in which component (a) constitutes 10 to 90 weight percent of the total of components (a) and (b) and component (b) constitutes the remaining weight where the total weight of (a) plus (b) is 100 weight percent.

* * * * *